United States Patent [19]

Kikuchi

[11] Patent Number: 5,620,559
[45] Date of Patent: Apr. 15, 1997

[54] HYDROGEN RADICAL PROCESSING

[75] Inventor: Jun Kikuchi, Kawasaki, Japan

[73] Assignee: Fujitsu Limited, Kawasaki, Japan

[21] Appl. No.: 404,735

[22] Filed: Mar. 15, 1995

[30] Foreign Application Priority Data

Mar. 18, 1994 [JP] Japan .................................. 6-049547

[51] Int. Cl.⁶ .............................. B44C 1/22; C03C 15/00; C03C 25/06; C23F 1/00
[52] U.S. Cl. ............................ 438/723; 134/1.1; 216/68; 216/70; 216/79; 438/743
[58] Field of Search ............................ 156/643.1, 646.1, 156/653.1, 657.1, 626.1; 134/1.1; 216/68, 70, 79

[56] References Cited

U.S. PATENT DOCUMENTS

| | | | |
|---|---|---|---|
| 4,264,374 | 4/1981 | Beyer et al. | 134/3 |
| 5,022,961 | 6/1991 | Izumi et al. | 156/646 |
| 5,089,441 | 2/1992 | Moslehi | 134/1 |
| 5,112,437 | 5/1992 | Watanabe et al. | 156/646 |
| 5,167,761 | 12/1992 | Westendorp et al. | 156/635 |
| 5,326,723 | 7/1994 | Petro et al. | 437/192 |
| 5,328,558 | 7/1994 | Kawamura | 156/643 |
| 5,403,434 | 4/1995 | Moslehi | 156/643 |
| 5,413,670 | 5/1995 | Langan et al. | 156/643.1 |
| 5,454,903 | 10/1995 | Redeker et al. | 156/643.1 |
| 5,458,724 | 10/1995 | Syverson et al. | 156/646.1 |
| 5,505,816 | 4/1996 | Barnes et al. | 156/646.1 |

FOREIGN PATENT DOCUMENTS

| | | | |
|---|---|---|---|
| 2-77124 | 3/1990 | Japan | 156/643.1 |
| 4-72727 | 3/1992 | Japan | 156/646.1 |

OTHER PUBLICATIONS

A. Izumi et al., HF/$CH_{30}$(Alcohol) Vapor Cleaning <HAVC> and Its Application to Polycrystalline Silicon/Silicon Contact Formation, Extended Abstracts of the 1993 International Conference on Solid State Devices and Materials, Makuhari, 1993, pp. 534–536, Japan.

Higashi et al, "Ideal hydrogen termination of the Si (111) surface," *Appl. Phys. Lett.*, vol. 56, No. 7, Feb. 12, 1990, pp. 656–658.

Takahagi et al., "Control of the chemical reactivity of a silicon single-crystal surface using the chemical modification technique," *J. Appl. Phys.*, vol. 68, No. 5, Sep. 1, 1990, pp. 2187–2191.

Kishimoto et al., "*In-Situ* RHEED Monitoring of Hydrogen Plasma Cleaning on Semiconductor Surfaces," *Japanese Journal of Applied Physics*, vol. 29, No. 10, Oct. 1990, pp. 2273–2276.

*Primary Examiner*—Glenn A. Caldarola
*Assistant Examiner*—J. Pasterczyk
*Attorney, Agent, or Firm*—Staas & Halsey

[57] ABSTRACT

A method of manufacturing a semiconductor device. The method includes the application of a gas containing HF vapor and $H_2O$ or alcohol vapor to a substrate. An excitation energy is applied to a flow of gas containing hydrogen to generate a plasma. Gas containing nitrogen fluoride is added to the gas containing hydrogen at a first position which is downstream from the place where the plasma is generated and at which the concentration of high energy particles in the gas containing hydrogen is negligible. The HF treated substrate is exposed to the gas containing nitrogen fluoride at a second position which is further downstream than the first position where the nitrogen fluoride is added.

12 Claims, 12 Drawing Sheets

HYDROGEN RADICAL PROCESSING

BACKGROUND OF THE INVENTION a) Field of the Invention

The present invention relates to a semiconductor device manufacturing technique particularly suitable for removing a native oxide film from the surface of a silicon substrate. In this specification, the term "native oxide film" is used to mean imperfect oxide films other than thermal oxidation films.

b) Description of the Related Art

The surfaces of many semiconductors and metals are easily oxidized in air and native oxide films are formed thereon. A native oxide film formed on the surface of a Si substrate has a thickness of about 2 nm (measured by ellipsometry) and is called an imperfect silicon oxide film.

A silicon oxide film is an insulating material. If a silicon oxide film remains on the surface of a Si substrate, the contact resistance of an electrode connected to a conductive region on the Si substrate is increased.

A native oxide film on a Si substrate surface is a silicon oxide film having an imperfect crystallinity and having a film quality inferior to a thermally oxidized Si film. As the size of a MOSFET is scaled down, the gate oxide film often becomes as thin as 10 nm or less. For example, in a case where gate oxide film of 5 nm thickness is to be formed, if a poor quality native oxide film of 2 nm thickness is left on the surface of a Si substrate, a resultant gate oxide film will have degraded film characteristics.

A wet process using diluted hydrofluoric acid is known as a process of removing a native oxide film on a Si substrate (G. S. Higashi et al., Appl. Phys. Lett., 56, p. 656, 1990). A native oxide film on the surface of a Si substrate immersed in a diluted hydrofluoric acid solution dissolves to expose a bare Si surface, and hydrogen atoms terminate the dangling bonds at the Si substrate surface.

Although native oxide film removal using diluted hydrofluoric acid forms a stable Si substrate surface on the (1 1 1) plane, it forms a surface with a lower stability on the (1 0 0) plane. This wet process using diluted hydrofluoric acid presents some difficulties in proceeding directly to the next dry process because of a danger that the Si substrate surface may be again oxidized while the substrate is transported to the dry process system.

As another process of removing a native oxide film on a Si substrate, a dry process using hydrogen plasma is known (A. Kishimoto et al., Jpn. J. Appl. Phys., 29, p. 2273, 1990). This dry process of removing a native oxide film on a Si substrate can essentially and easily be followed by the next dry process. However, there is a danger that the Si substrate surface may be damaged because the Si substrate exposed in a plasma is impacted by collisions with high energy particles such as ions and electrons.

As still another process of removing a native oxide film on a Si substrate, a dry process using hydrogen atoms (radicals) is known (T. Takahagi et al., J. Appl. Phys., 68, p.2187, 1990). Although this dry process using hydrogen atoms (radicals) presents no danger of damage to the Si substrate surface, the process speed is low, and according to this paper, it takes time or the order of an hour to remove a native oxide film on a Si substrate surface.

As described above, it is not always easy to efficiently remove a native oxide film on a semiconductor substrate surface at any desired time during semiconductor device manufacturing processes.

SUMMARY OF THE INVENTION

It is an object of the present invention to provide a semiconductor device manufacturing method capable of efficiently removing a native oxide film on the surface of a semiconductor substrate.

It is another object of the present invention to provide a semiconductor device manufacturing apparatus capable of efficiently removing a native oxide film on the surface of a semiconductor substrate.

It is still another object of the invention to provide a semiconductor device manufacturing technique capable of removing a native oxide film on the surface of a semiconductor substrate by using a dry process with ease and without causing any damage to the semiconductor substrate surface.

According to one aspect of the present invention, there is provided a method of manufacturing a semiconductor device including the steps of: (a) treating a substrate by applying HF vapor thereto and $H_2O$ or alcohol vapor; (b) applying an excitation energy to a flow of gas containing hydrogen and exciting the gas containing hydrogen into a plasma state; (c) adding gas containing nitrogen fluoride to the gas containing hydrogen at a position downstream from the place where the plasma is formed; and (d) processing the HF treated substrate by exposing the HF treated substrate to gas containing nitrogen fluoride and hydrogen at position further downstream than position where said nitrogen fluoride was added.

According to another aspect of the present invention, there is provided an apparatus for manufacturing a semiconductor device including: an acid-proof process chamber capable of being evacuated; means for supplying HF vapor and $H_2O$ or alcohol vapor to the acid-proof process chamber; a gas flow passage capable of being evacuated including a plasma generating region and an additive gas introducing region disposed downstream from the plasma generating region; means for supplying gas containing hydrogen to the gas flow passage; means for applying plasma excitation energy to the plasma generating region of the gas flow passage; means for supplying gas containing nitrogen fluoride to the additive gas introducing region of the gas flow passage; a downflow process chamber connected at a downstream position from the gas flow passage and capable of being evacuated; and a transportation passage capable of being evacuated, for coupling the acid-proof process chamber and the downflow process chamber.

A native oxide film can be efficiently removed by using HF vapor and $H_2O$ or alcohol vapor.

Plasma gas containing hydrogen includes hydrogen ions and radicals. It has been found that the concentration of hydrogen radicals is increased by adding nitrogen fluoride at a position downstream from the plasma generating region. HF process byproducts on the substrate surface can be efficiently removed by processing the substrate with a gas containing hydrogen radicals.

A native oxide film can be removed by the HF vapor process. A plasma is formed in a hydrogen containing gas and $NF_3$ is added along with water vapor at a downstream position. A semiconductor substrate is contacted with such $NF_3$ containing gas at the more downstream position. In this manner, residual by-products on the surface of the semiconductor substrate can be efficiently removed. The semiconductor surface with the native oxide film having been removed includes dangling bonds that are terminated by hydrogen atoms. With these processes, a clean surface of semiconductor can be obtained.

DETAILED DESCRIPTION OF THE PREFERRED EMBODIMENTS

Figure 1:
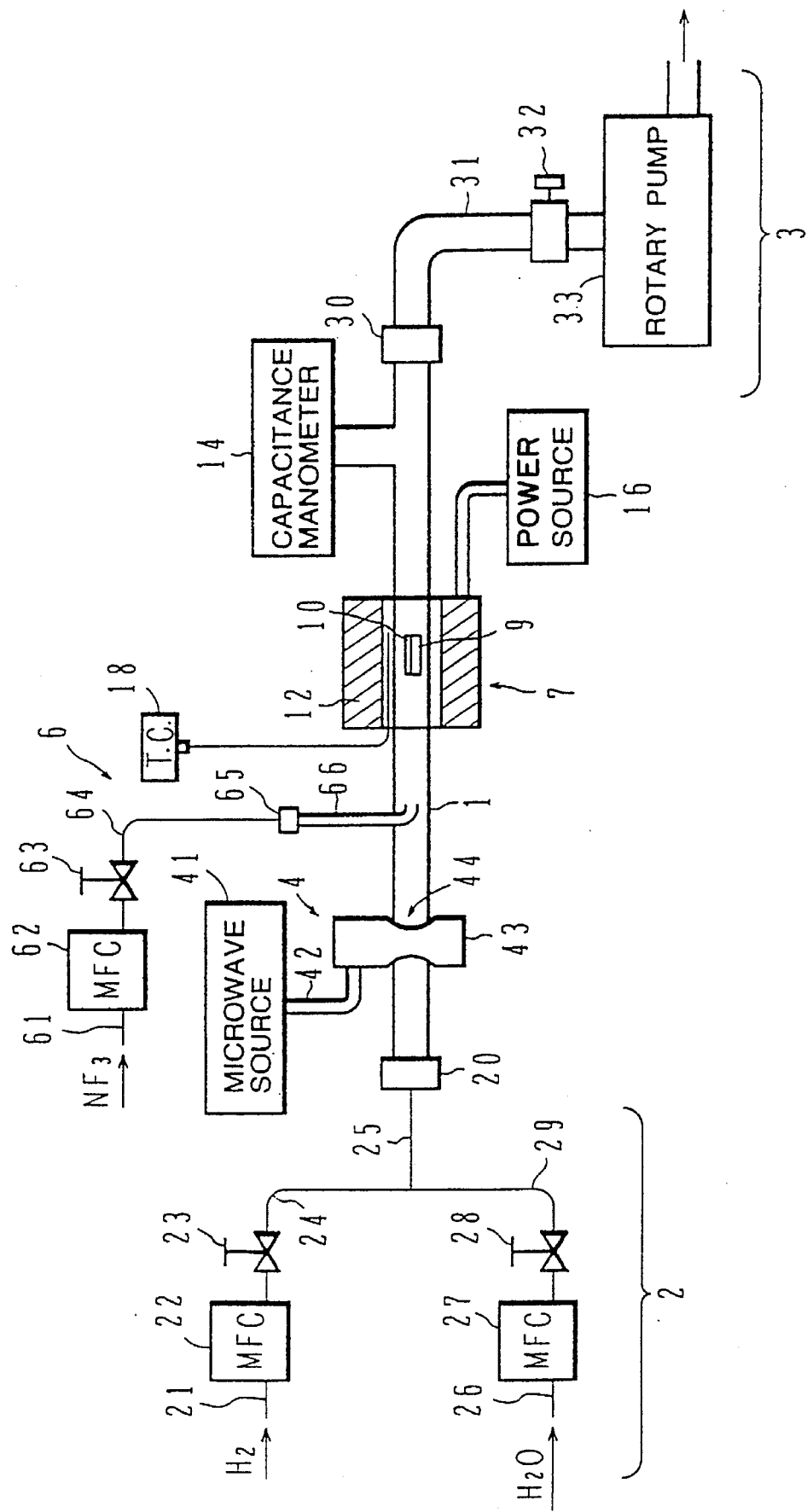
FIG. 1 is a schematic diagram partially in section showing the structure of a hydrogen plasma downflow processing system.

FIG. 1 shows the structure of a hydrogen plasma downflow processing system used for preparatory experiments. The experiments were conducted in order to study the effects of removing a native oxide film on a silicon substrate by using hydrogen radicals, and the processing system was constructed in a simple style.

Open ends of a quartz tube 1 having an inner diameter of about 9 mm are connected to a (hydrogen+water vapor) introducing system 2 and an evacuation system 3, respectively. The (hydrogen+water vapor) introducing system 2 includes a mass flow controller 22 connected to a hydrogen pipe 21, a valve 23 connected downstream from the mass flow controller 22, a pipe 24 extending to a mixing point, a mass flow controller 27 connected to a water vapor pipe 26, a valve 28 connected downstream from the mass flow controller 27, a pipe 29 extending to the mixing point, and a pipe 25 for supplying a mixed gas from the mixing point to a joint 20. A mixed gas of $H_2+H_2O$ having a desired mixing ratio can be supplied to the joint 20 by adjusting the mass flow controllers 22 and 27.

The evacuation system 3 includes a joint 30 connected to the quartz tube 1, a pipe 31, a valve 32, and a rotary pump 33. The inside of the quartz tube 1 can be evacuated to a desired degree of vacuum by adjusting the valve 32. A capacitance manometer 14 is connected to the quartz tube 1 near the downstream end thereof, the manometer 14 being capable of measuring a vacuum degree within the quartz tube 1.

A gas excitation system 4 includes a microwave source 41, and a waveguide means 42 for guiding microwaves from the microwave source 41 to a microwave cavity 43. The waveguide means 42 is a coaxial cable in this embodiment. If the system scale is large, a hollow waveguide tube may be used as the waveguide means 42. The microwave cavity 43 can be divided into two parts which jointly enclose the quartz tube 1. The region of the quartz tube 1 surrounded by the microwave cavity 43 is a plasma generating region 44.

An additive gas introducing system 6 is connected to the quartz tube 1 at a position which is downstream from the microwave cavity 43 by about 20 cm. The additive gas introducing system 6 includes a mass flow controller 62 connected to an $NF_3$ pipe 61, a valve 63 connected downstream from the mass flow controller 62, a pipe 64 connected downstream from the valve 63, a joint 65, and a coupling quartz tube 66 connected to the quartz tube 1. $NF_3$ gas can be added at a desired flow rate by adjusting the mass flow controller 62.

A processing part 7 of the quartz tube 1 in which a silicon chip 9 with a native oxide film 10 thereon is placed, is located at a position that is downstream from the coupling quartz tube 66 of the additive gas introducing system 6 by about 80 cm (although the processing part 7 is depicted nearer to the additive gas introducing system 6 in FIG. 1). A heater 12 surrounds the processing part 7. The temperature at the outer periphery of the quartz tube 1 is measured by a thermocouple 18. The heater 12 is supplied with a controlled current from a power source 16.

First, the reason why the additive gas introducing system 6 is installed at a position that is downstream from the plasma generating region 44 by about 20 cm, will be explained. As ($H_2+H_2O$) gas is introduced from the gas introducing system 2 and plasma is generated in the plasma generating region 44 by irradiating microwaves in the microwave cavity 43, the generated plasma flows downstream, being conveyed by the gas flow. The plasma contains hydrogen ions and electrons at a high energy state. These high energy particles may react with nitrogen fluoride and generate dangerous fluorine radicals. However, at a position downstream from the plasma generating region 44 by about 20 cm, high energy particles (ions and electrons) have decayed such that the concentration thereof has become negligible.

The experimental results were not good when $NF_3$ gas was introduced into the $H_2+H_2O$ at a region where plasma is generated or still resident. For this reason, the additive gas introducing system 6 was connected to the system at a position downstream from the plasma generating region 44 by about 20 cm.

It was confirmed experimentally that it is effective to introduce $NF_3$ gas at a region where the concentration of high energy particles in the plasma of ($H_2+H_2O$) mixed gas has become negligible, for removing a native oxide film on a silicon chip. By using the structure shown in FIG. 3, the downstream position from the additive gas introducing system 6 for effective placing of a silicon chip was studied.

An electron spin resonance (ESR) measuring apparatus 11 was set at the downstream position from the additive gas introducing system 6 to detect hydrogen radicals in a reaction tube 1. The distance between the additive gas introducing system 6 and the ESR measuring apparatus 11 was changed among about 40 cm, 60 cm, and 80 cm. As the distance was increased, the density of detected hydrogen radicals was higher. This indicates that hydrogen gas (or its derivatives) in a plasma state and $NF_3$ gas may possibly react with each other by some chemical reaction and hydrogen radicals are increased. It has been found that by-products of this chemical reaction are effective for etching a native oxide film on a silicon chip.

In order to ensure a sufficient reaction, the processing part 7 was positioned at a downstream position about 80 cm, from the additive gas introducing system 6.

The reason why the gas introducing system 2 introduces water vapor in addition to hydrogen gas is as follows. Under the condition that hydrogen gas only was introduced and plasma was generated, the concentration of hydrogen radicals in the plasma rapidly decreased as the plasma gas flowed downstream in the quartz tube 1. In the case of a mixed gas of hydrogen gas and water vapor, the rate of decrease of the hydrogen radical concentration was greatly diminished. It is theorized that the water vapor causes the formation of a water vapor film on the inner wall of the quartz tube 1 and this water vapor film reduces the reaction of hydrogen radicals at the tube inner wall. Accordingly, in order to extinguish hydrogen ions and electrons in the plasma as quickly as possible and to maintain the concentration of hydrogen radicals as long as possible, $H_2+H_2O$ mixed gas was introduced and the additive gas introducing system 6 was installed at a position that is downstream from the plasma generating region by about 20 cm.

With the above settings, a native oxide film 10 on a silicon chip 9 could be etched at a practically usable etch rate, by introducing $H_2+H_2O$ mixed gas from the gas introducing system 2, generating microwave plasma in the plasma generating region 44, and introducing $NF_3$ gas from the additive gas introducing system 6.

Since this native oxide film removing system uses a dry process, it can be easily coupled with other dry processing systems. For example, this native oxide film removing system may be used for a preparatory process for a film forming system such as a chemical vapor. deposition (CVD) system and a sputtering system.

Although a mixed gas of hydrogen gas and water vapor was used in the experiments, other gases may by used in place of water vapor so long as they generate $H_2O$ in the plasma generating region. For example, a molecule containing at least one oxygen atom may be used.

The quartz tube constituting a chamber may be made of other materials containing silicon oxide.

Dangling bonds are exposed on the surface of a silicon chip after its native oxide film is removed. It is preferable to terminate dangling bonds by coupling the same with hydrogen or other atoms.

Next, a process capable of terminating dangling bonds with hydrogen atoms will be described.

Figure 2A:
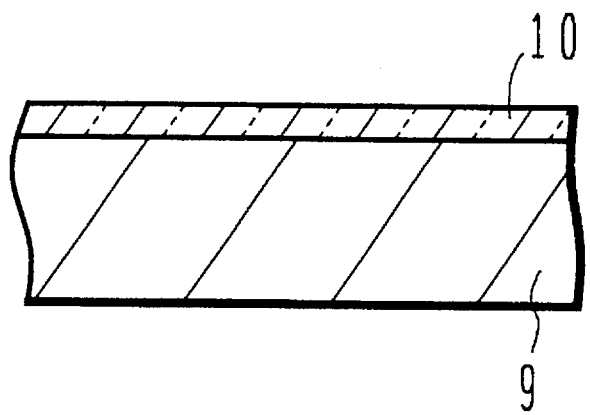
FIGS. 2A and 2B are schematic cross sectional views showing the structure of a silicon chip processed by the processing system shown in FIG. 1.

The hydrogen plasma downflow processing system shown in FIG. 1 was used, and a silicon chip 9 shown in FIG. 2A was used as a sample which has a native oxide film 10 of about 1.3 nm thickness. In order to facilitate a comparison to a conventional technique, the silicon chip 9 having the (1 1 1) plane was used.

The silicon chip 9 is placed in the processing part 7 of the processing system shown in FIG. 1. Thereafter, the inside of the quartz tube or chamber 1 is evacuated by the evacuation system 3. While the inside of the chamber 1 is evacuated, hydrogen gas is introduced from the gas introducing system 2 into the quartz tube 1 at a flow rate of 80 sccm.

Next, microwaves having a frequency of 2.45 GHz are introduced through the microwave cavity 43 into the microwave generating region 44 at about 20 W. As a result, hydrogen gas in the plasma generating region 44 is dissociated to generate hydrogen ions, electrons, and radicals. Plasma gas is present only near the plasma generating region 44 and does not flow downstream to the position of the additive gas introducing system 6. Hydrogen radicals flow downstream to the position of the additive gas introducing system 6, being conveyed by the gas flow.

$NF_3$ gas is introduced from the additive gas introducing system 6 into the chamber 1 at a flow rate of 90 sccm. $NF_3$ gas is mixed and reacted with the hydrogen gas which contains hydrogen radicals.

Thereafter, water vapor is additionally introduced from the gas introducing system 2 at a flow rate of 20 sccm to add $H_2O$ to the hydrogen plasma. The pressure of the inside of the chamber 1 is controlled to be about 3 Torr.

If $H_2O$ is not added, most of hydrogen radicals in activated gas flowing downstream from the plasma generating activated gas flowing downstream from the plasma generating region are transformed into hydrogen molecules through recombination at the inner wall of the quartz tube 1. If $H_2O$ is added, reduction of hydrogen radicals is suppressed considerably and hydrogen radicals not negligible in amount flow downstream to the position of the additive gas introducing system 6. The hydrogen radicals and the $NF_3$ in the activated gas react with each other by some chemical reaction as they flow downstream in the quartz tube 1.

Figure 2B:
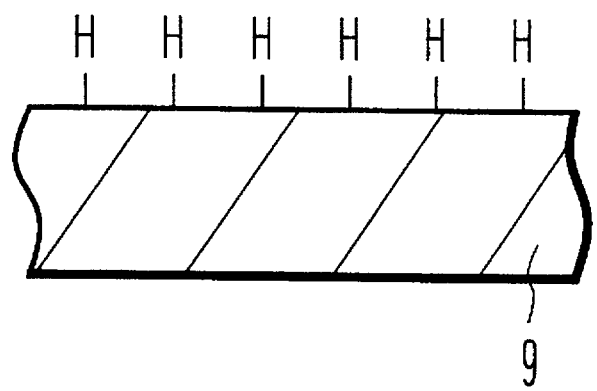

As this state is maintained for 15 minutes, the native oxide film 10 on the silicon chip 9 is removed as shown in FIG. 2B, and a hydrogen terminating process continues so that hydrogen atoms are coupled to dangling bonds on the surface of the silicon chip 9.

The presence of a native oxide film was judged depending on whether the surface of a silicon substrate is hydrophilic or hydrophobic. It was judged that a native oxide film 10 is present if the surface is hydrophilic, and that a native oxide film 10 has been removed if the surface is hydrophobic.

In order to terminate the native oxide film removing process, the supply of water vapor gas and $NF_3$ gas was stopped in this order. Thereafter, the supply of microwaves was stopped to terminate the generation of plasma, and then the supply of hydrogen gas was stopped.

With the above process, a native oxide film can be removed by hydrogen radicals in a time of the order of 15 minutes or shorter, as compared to the conventional technique which requires a removal time on the order of hours.

Furthermore, a silicon chip is processed at a position more downstream than the position where $NF_3$ gas is added, the latter position being more downstream than the region where the plasma generated at the plasma generating region has become negligible. The chemical reaction by radicals becomes dominant so that damage to a silicon chip caused by high energy particles is diminished. Still further, the silicon surface becomes chemically stable because dangling bonds on the silicon surface are considered to be terminated by hydrogen atoms.

Regarding the sequential order of processes, it is preferable to introduce hydrogen gas, generate plasma, introduce $NF_3$ gas, and introduce $H_2O$ gas in this order, and to stop the supply of these gases in the reverse order. For example, if the supply of water vapor is stopped last, there is a fear that an oxide film may be formed on the silicon chip surface by water vapor.

Figure 4A:
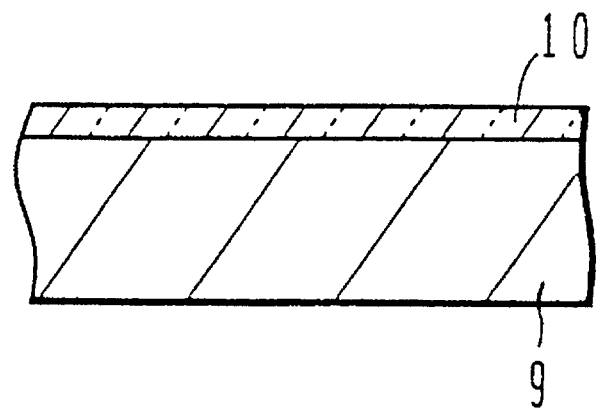
FIGS. 4A and 4B are schematic cross sectional views showing the structure of a silicon chip processed differently for the comparison with the embodiment processing.
Figure 4B:
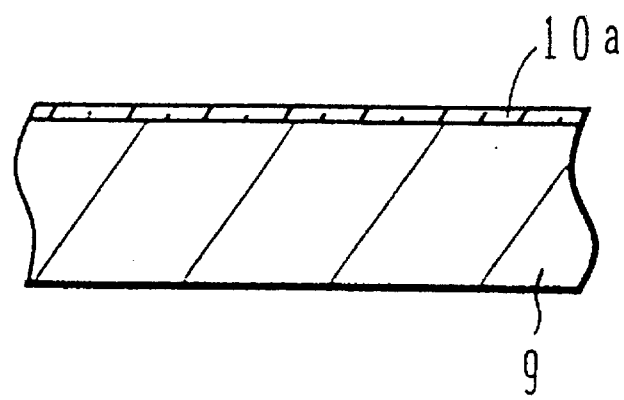

Etching without adding $NF_3$ gas was tested. A silicon chip was processed using the same conditions and processes as the above-described embodiment except that $NF_3$ gas was not added. With such a process it was not possible to fully remove the native oxide film even if the process was continued for 60 minutes or longer. The sample shown in FIG. 4A changed to the sample shown in FIG. 4B which is considered to have a native oxide film 10a left unetched.

A native oxide film could not be removed without causing damage on the substrate surface, when $NF_3$ gas was introduced into the quartz tube 1 at the position of the plasma generating region.

Figure 3:
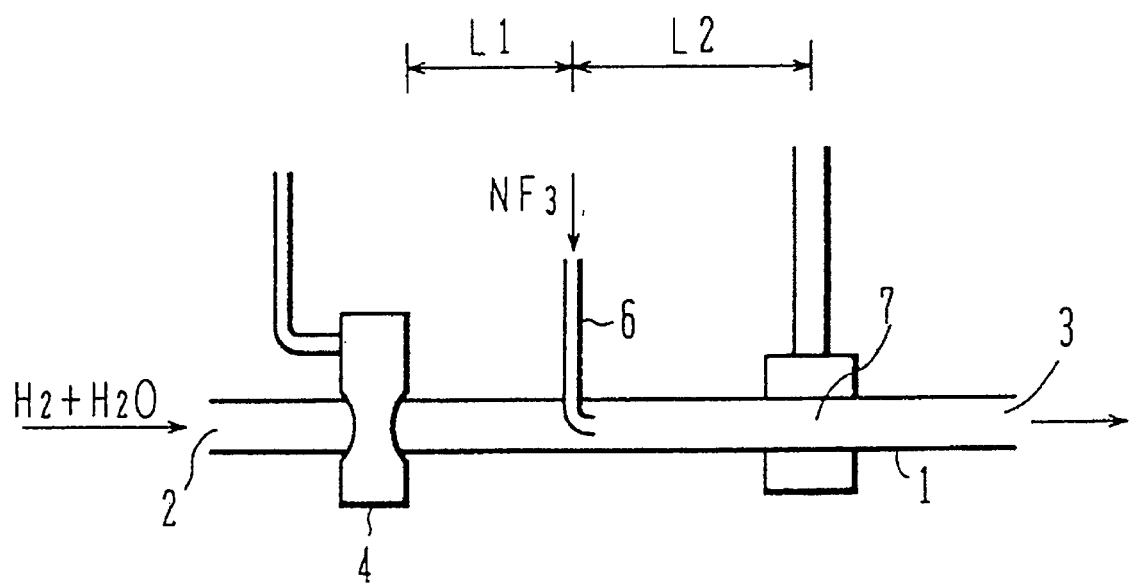
FIG. 3 is a schematic cross sectional view showing the structure used for the analysis of the processing system shown in FIG. 1.
Figure 5A:
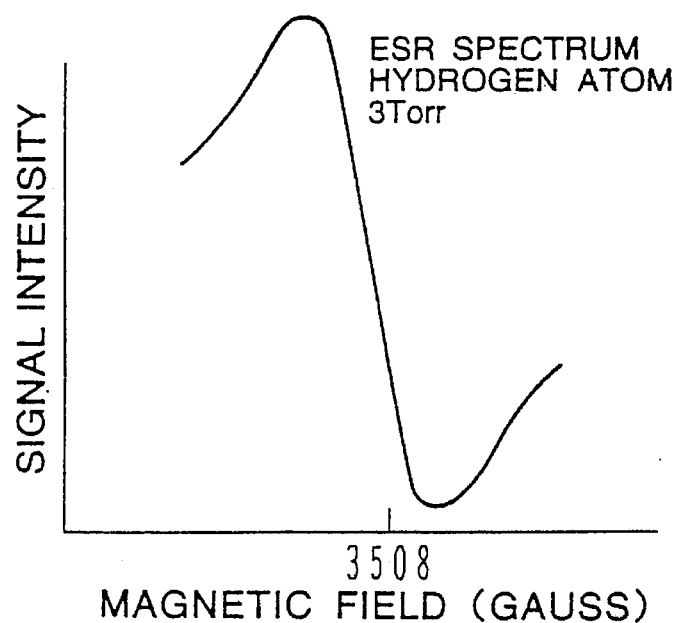
FIGS. 5A and 5B are graphs showing the comparison results of the embodiment processing and the comparative processing, respectively using the system shown in FIG. 3.

In order to check this phenomenon, the amount of hydrogen radicals at the processing part 7 was measured by using the structure shown in FIG. 3. Activated gas was caused to flow in the same manner as the above-described processes and spectra shown in FIG. 5A were obtained. The abscissa represents a magnetic field intensity in Gauss units, and the ordinate represents a signal intensity in an arbitrary unit.

Figure 5B:
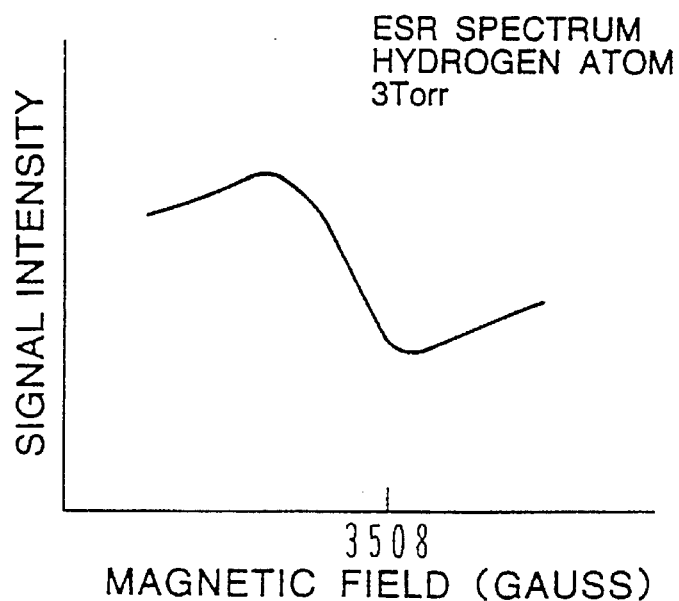

The results shown in FIG. 5B with the same abscissa and ordinate stand for a comparison example wherein $NF_3$ gas was not added and the other conditions were maintained the same as the embodiment. In these experiment results, it is considered that a difference between upper and lower peaks is approximately proportional to the number of hydrogen atoms present in the reaction gas.

From the experiment results, it can be understood that the concentration of hydrogen atoms for the above-described process is larger than that for the comparison example. Although the mechanism is not certain, addition of $NF_3$ gas may theoretically produce a reaction which increases hydrogen radicals. A reaction between $NF_3$ gas and hydrogen gas (containing hydrogen radicals) may theoretically promote a reaction of removing a native oxide film.

Although a native oxide film can be removed in a short time without causing any damage on a silicon chip by the above-described process, by-products may exist on the surface of a silicon chip after a native oxide film is removed.

Figure 6A:
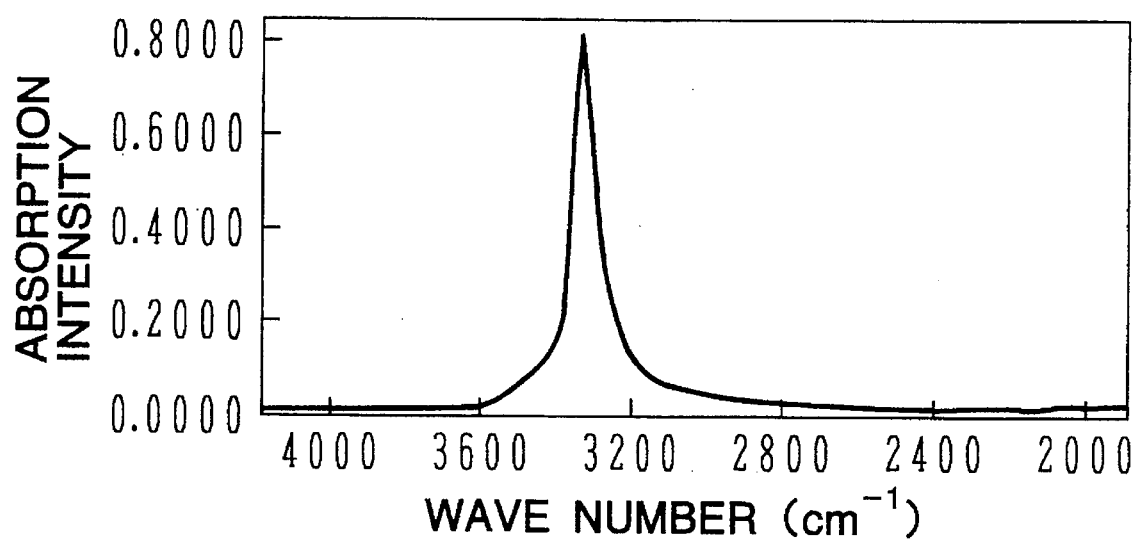
FIGS. 6A to 6D are graphs showing Fourier Transform—Infra Red (FT-IR) spectra of residues on the silicon surface after a native oxide film was removed and the silicon surface further processed.

FIG. 6A shows FT-IR spectra of by-products on the surface of a silicon chip after the native oxide film removing process. The measurement is done by attenuated total reflection (ATR) method. The abscissa represents a wave number ($cm^{-1}$), and the ordinate represents an absorption intensity. As shown in FIG. 6A, an absorption peak of the infrared absorption spectra appears in the wave number region of 3200 to 3600 $cm^{-1}$. This absorption peak is an absorption not by silicon but by by-products on the silicon chip surface.

These by-products will diminish automatically if the silicon chip is simply left alone for about 12 hours without any processing. However, holding a silicon chip for about 12 hours after the native oxide film removing process is not good from the viewpoint of manufacturing throughput, and there is a possibility of reoxidation of the silicon chip surface in 12 hours. It is therefore desired to remove by-products in a short time.

By-products can be removed, for example, by heating or cleaning.

The hydrogen plasma downflow processing apparatus shown in FIG. 1 has the heater 12 disposed at the outer peripheral area of the processing part 7 so that a silicon chip 9 can be heated to a desired temperature. Silicon chips 9 after native oxide films were removed, were heated at various temperatures to check whether or not any by-product was still present on the surface of a silicon chip. It has been found that by-products can be removed if the temperature is raised to 60° C. or higher. It is preferable from the viewpoint of mass production to raise the temperature to 80° C. or higher.

Figure 6B:
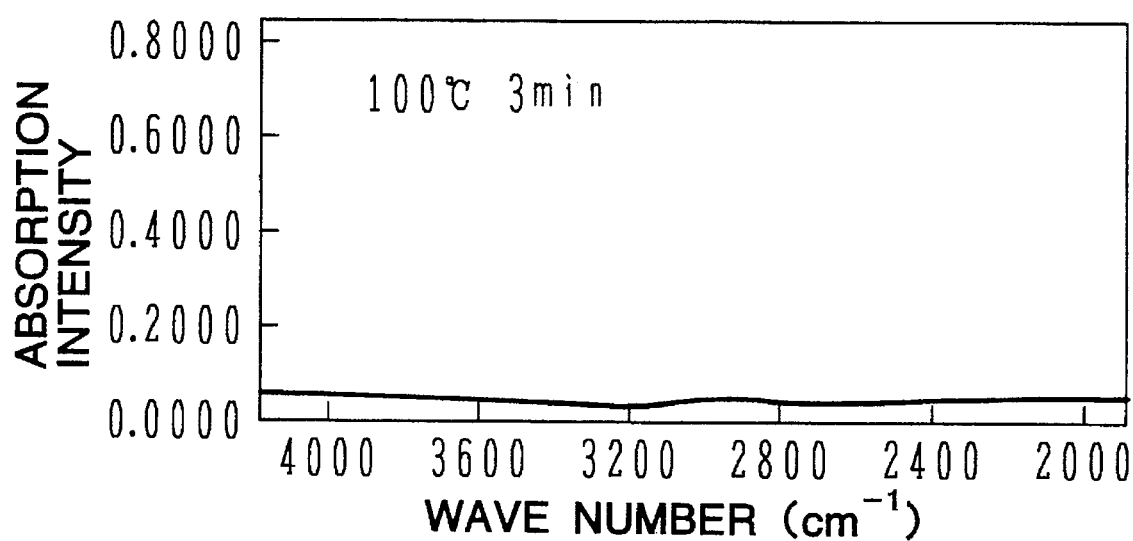
Figure 6C:
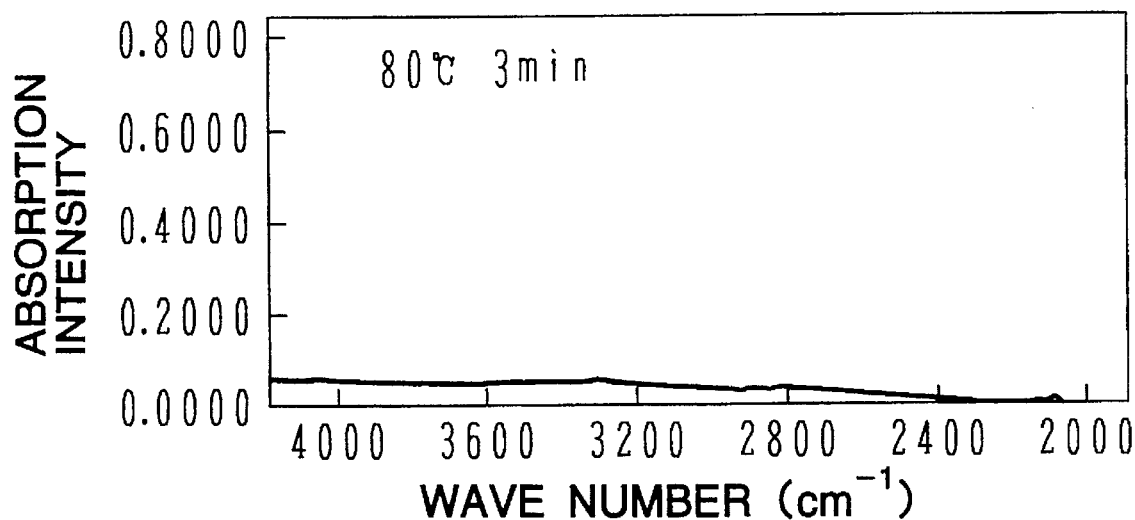
Figure 6D:
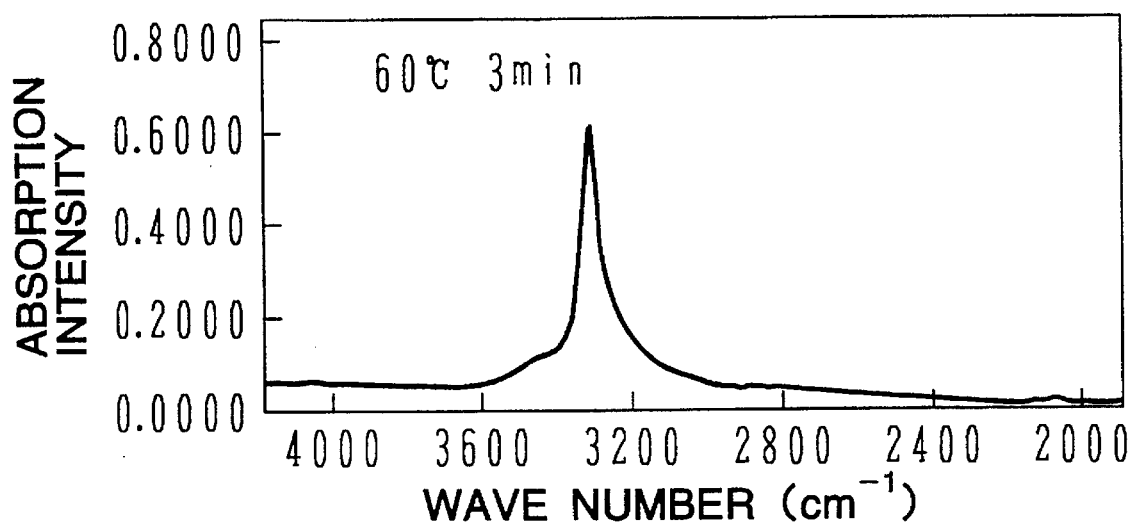

The FT—IR spectra of a silicon chip heated for about 3 minutes at a temperature of 100° C. after the native oxide film was removed, are shown in FIG. 6B. Similar FT—IR spectra of a silicon chip heated for about 3 minutes at a temperature of 80° C. are shown in FIG. 6C. FIG. 6D shows a similar spectra when the chip was heated at 60° C. for 3 minutes. It is seen that heating at 60° C. for 3 minutes is also effective for removing by-products. It can be understood from the comparison with FIG. 6A that the absorption peak near the wave number of 3350 $cm^{-1}$ has almost completely disappeared in FIGS. 6B and 6C. By-products can be removed in a short time by raising a temperature to about 80° C. Therefore, by-products can be removed without lowering a throughput of the native oxide film removing process, and a clean silicon substrate surface can be obtained.

Figure 7A:
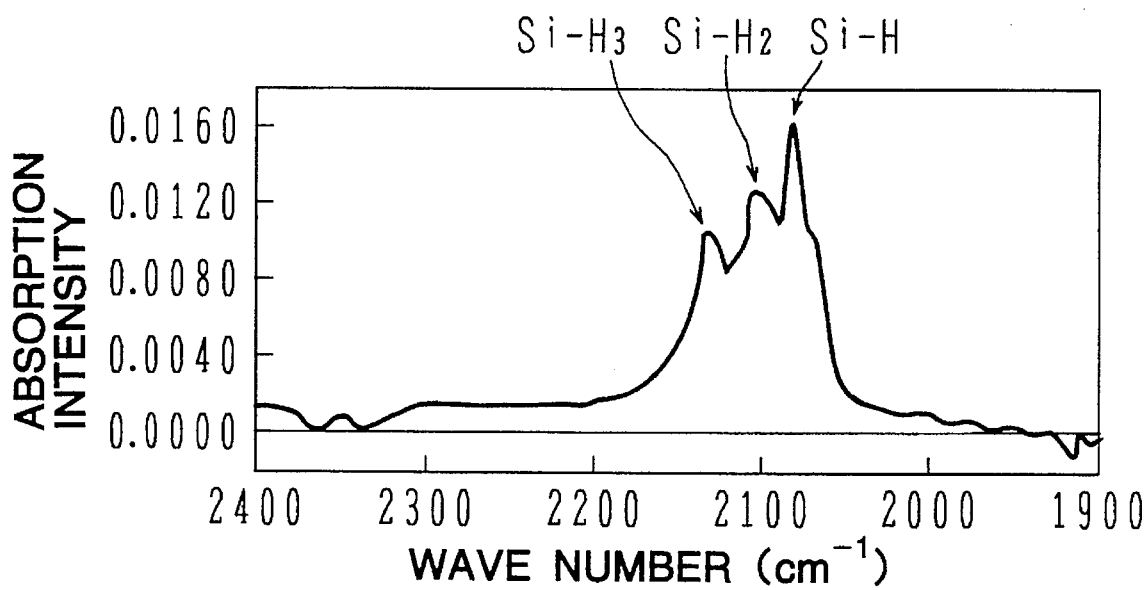
FIGS. 7A and 7B are graphs showing FT-IR spectra of a semiconductor surface processed after a native oxide film was removed.

The detailed observation of the FT—IR spectra of the silicon substrate surface after heating showed an absorption structure as shown in FIG. 7A. It is to be noted that the absorption intensity on the ordinate of FIG. 7A is 1/50 of the absorption intensity shown in FIGS. 6A and 6B.

As shown in FIG. 7A, three infrared absorption peaks appear in the wave number range of 2020 to 2150 $cm^{-1}$. These peaks correspond to Si—$H_3$, Si—$H_2$, and Si-H bonds from the left to the right in FIG. 7A. It is therefore considered that silicon dangling bonds on the surface of the silicon chip after heating are terminated by hydrogen atoms.

In the heating process for removing by-products described above, a silicon chip is placed in a hydrogen atmosphere. Instead of the hydrogen atmosphere, other gases such as nitrogen and argon which do not damage a silicon surface may be used. A high vacuum atmosphere may also be used.

Figure 8:
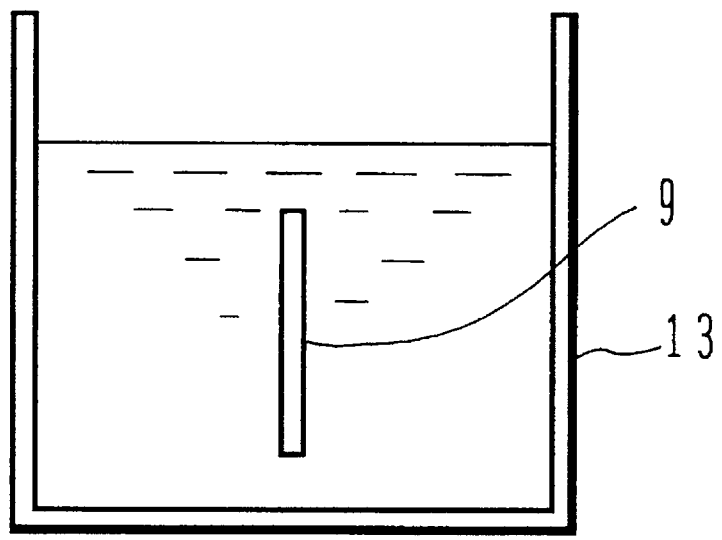
FIG. 8 is a schematic cross sectional view showing an example of the process after a native oxide film was removed.

By-products attached to the surface of silicon may be removed by washing with water. After a native oxide film on the surface of a silicon chip was removed by the above-described process, the silicon chip 9 was taken out of the processing system and rinsed in a washing vessel 13 such as shown in FIG. 8 containing pure water having a reduced amount of dissolved oxygen therein. The amount of dissolved oxygen is, for example, 80 ppb. By-products on the surface of a silicon chip 9 can be removed by washing the chip in the water for about 2 minutes for example.

If a washing time is too long, there is a fear of oxidizing again the surface of silicon chip. It is therefore preferable to set the washing time to be 30 minutes or shorter. It is also preferable to use pure water processed to reduce dissolved oxygen. General pure water has dissolved oxygen of about 1 ppm. It is practically preferable to set the dissolved oxygen amount to be 10 to 100 ppb for 1M DRAM substrate and 20 to 50 ppb for 4M DRAM substrate.

The surface of a silicon chip after such a washing process was observed by ATR infrared spectroscopy. The absorption peak of by-products disappeared similarly to the spectra shown in FIG. 6B. The detailed observation of the absorption structure gave spectra shown in FIG. 7B.

Figure 7B:
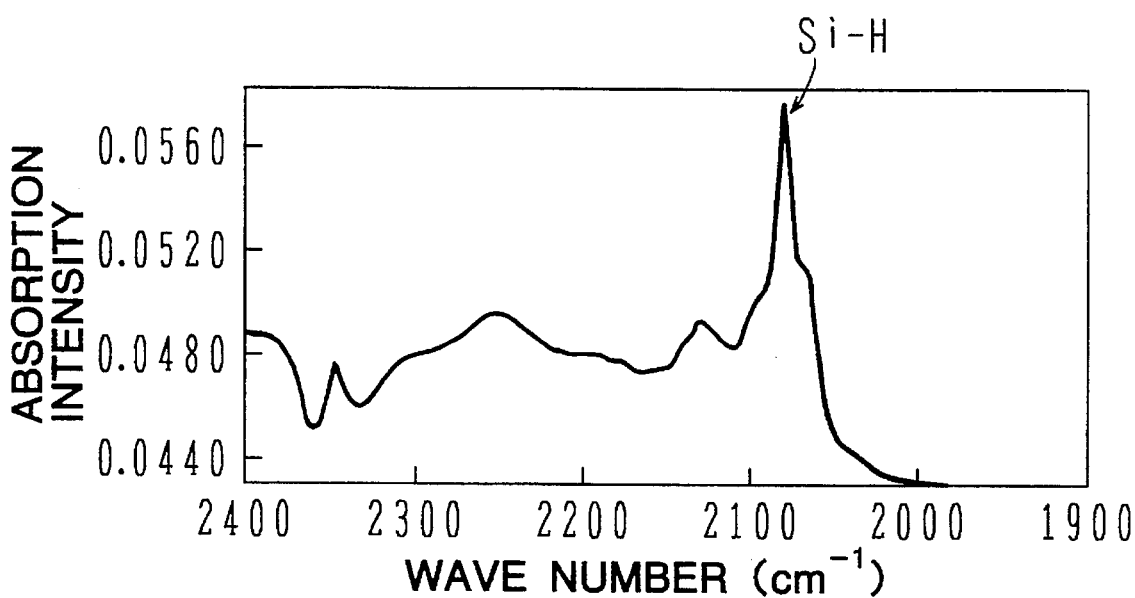

In FIG. 7B, the abscissa represents a wave number ($cm^{-1}$) similar to FIG. 7A, and the ordinate represents an absorption intensity and has a scale magnified more than that of FIG. 7A.

As shown in FIG. 7B, one peak of an Si—H bond appears in the wave number range of 2050 to 2100 cm$^{-1}$. As compared to the three peaks of FIG. 7A after the heating process, only one peak appears after the washing process. From these results, it is theorized that there is an unevenness of the order of atomic layers which exists on the surface of a silicon chip, which result in various crystallographic planes, after the heating process. In contrast with this, the surface of a silicon chip after the washing process is supposed to have a uniform and flat (1 1 1) plane to the level of atomic layer.

It has been found that by-products on a silicon chip can be efficiently removed by washing the chip for about 2 minutes by using pure water having a reduced amount of dissolved oxygen. The total time required for removing a native oxide film is not prolonged so much even if this washing process is used. However, since the washing process is a wet process, there is some difficulty in directly coupling the process to the next dry process.

From the spectra shown in FIGS. 7A and 7B, it is considered that the surface of a silicon chip after the removal of by-products has been terminated by hydrogen atoms. If an oxide film is present on the surface of a silicon chip, a strong peak appears at the wave number of 2250 cm$^{-1}$. However, this peak hardly appears on the surface of a silicon chip after the heating process so that it is considered that an oxide film is hardly present.

The spectra of the surface of a silicon chip after the washing process have an absorption peak at the wave number of 2250 cm$^{-1}$. However, this peak is not so strong and an oxide film left can be considered to be negligible.

Figure 9A:
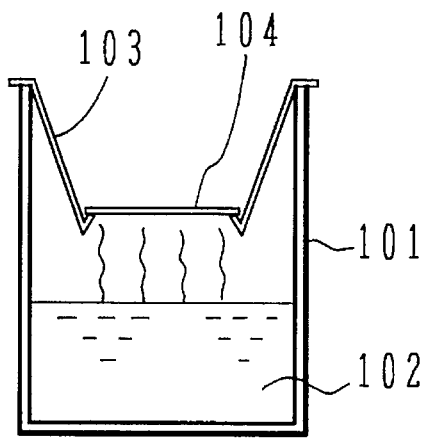
FIGS. 9A to 9C are schematic cross sectional views showing the structure of a silicon wafer surface processing system using an HF vapor process.
Figure 9C:
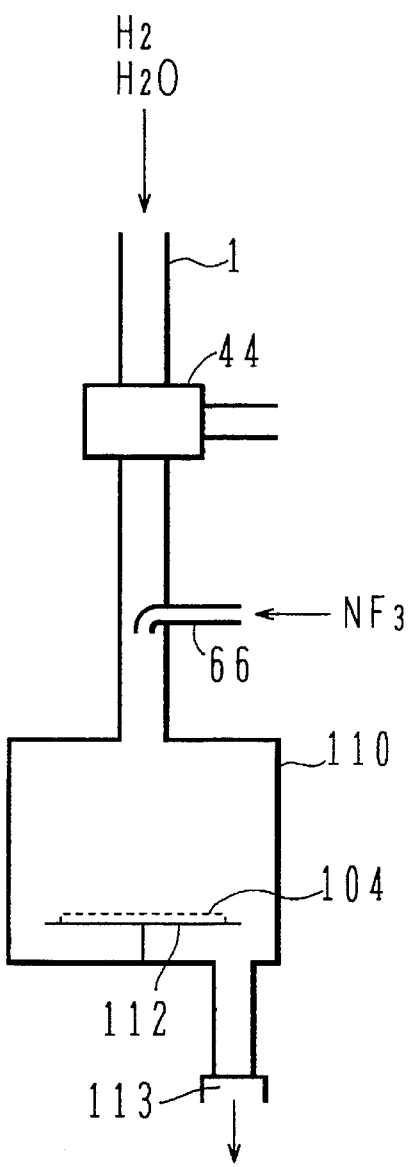
Figure 9B:
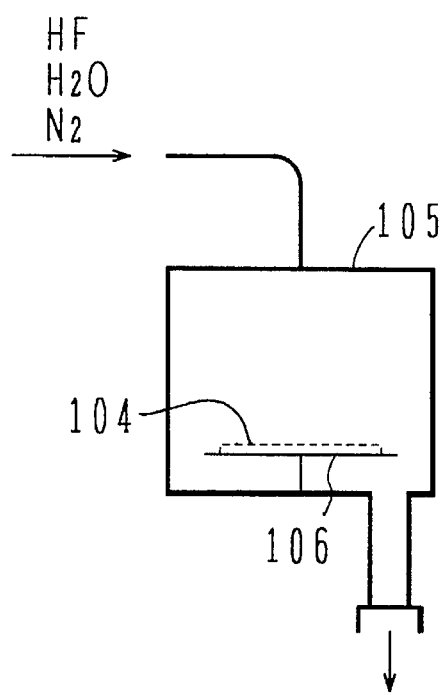

It is well known that a silicon oxide film can be removed by HF. FIGS. 9A to 9C show processing systems using HF vapor for removing a silicon oxide film. In the processing system shown in FIG. 9A, HF solution 102 is contained in a vessel 101 made of polytetrafluoroethylene (Teflon:trademark), and a jig 103 made of Teflon holds a wafer 104 at the position about 20 mm higher than the surface of HF solution 102. 10 V % HF aqueous solution may be used as HF solution 102. HF alcohol solution may be used as HF solution 102. As alcohol, $CH_3OH$, $C_2H_5OH$, or $C_3H_7OH$ may be used. Solvent of a mixture of alcohol and water may be used.

With 10 V % HF solution, a native oxide film of 1.3 nm formed by mixed sulfuric acid and hydrogen peroxide aqueous solution was removed in about 3 minutes.

HF may be used in a pure dry process without using HF solution. FIG. 9B shows the processing system using HF vapor. A silicon wafer 104 is held by a jig 106 made of Teflon and mounted in a hermetic chamber 105 made of Teflon. A mixed gas of HF, $H_2O$, and $N_2$ is introduced into the chamber 105 from the top thereof and exhausted from the bottom thereof. By supplying HF vapor mixed with other suitable gases, a native oxide film on the wafer 104 can be easily removed.

The silicon wafer 104 with its native oxide film having been removed by HF vapor is then placed in the downflow processing system shown in FIG. 9C. This system shown in FIG. 9C is theoretically equivalent to the processing system shown in FIG. 1. However, in this embodiment, the system of FIG. 9C is used for removing residual by-products and has a slightly modified structure suitable for mass production.

A microwave cavity 44 is disposed around a quartz tube 1 so as to introduce microwaves into the inside of the quartz tube 1. As ($H_2$ and $H_2O$) vapor is introduced from the top of the quartz tube 1, plasma is generated at the region surrounded by the microwave cavity 44. An additive gas introducing quartz tube 66 is coupled to the quartz tube 1 at a downstream position from the plasma generating region where plasma does not reach.

$NF_3$ gas is supplied from the additive gas introducing tube 66. A downflow processing chamber 110 is coupled to the quartz tube 1 at a more downstream position. A susceptor 112 capable of being heated with a heater is disposed at the lower area of the downflow processing chamber 110. Activated gas supplied from the quartz tube 1 flows down toward the top surface of the susceptor 112. An evacuation system 113 is connected to the downflow processing chamber 112.

In this embodiment, the silicon wafer 104 with its native oxide film having been removed by HF vapor is placed on the susceptor 112 in the downflow processing chamber 110. The silicon wafer 104 with its native oxide film having been removed by HF vapor has some residual by-products such as fluorine on the surface thereof.

Hydrogen gas is caused to flow and the pressure is set to 5 Torr. Next, microwaves of about 50 W at 2.45 GHz are supplied to the microwave cavity 44 to generate plasma in the plasma generating region. Next, $NF_3$ gas is added at a rate of 90 sccm at a position which is downstream from the generator by about 20 cm. Thereafter, $H_2O$ vapor is added at a rate of 20 sccm to the hydrogen plasma. At this time, the pressure in the quartz tube 1 is set to 5 Torr. Under this condition, the process is continued for about 5 minutes. Then, the supply of water vapor ($H_2O$) and $NF_3$ is stopped in this order, and then generation of plasma is stopped. Thereafter, while only hydrogen gas is supplied at a rate of 100 sccm, the wafer 104 is heated to 100° C. for 3 minutes under a pressure of 1 Torr.

This downflow process can efficiently remove residual by-products on the surface of a silicon wafer. Some residual or newly formed native oxide film on the surface of a silicon wafer, if any, can be removed by this downflow process as described earlier.

The surfaces of silicon wafers after the HF process by the processing systems shown in FIGS. 9A and 9B and the surfaces of the silicon wafers after the hydrogen radical process by the processing system shown in FIG. 9C were checked by XPS to observe residual fluorine. The amount of fluorine on the silicon surface after the hydrogen radical process by the processing system shown in FIG. 9C was found to be reduced.

Figure 10:
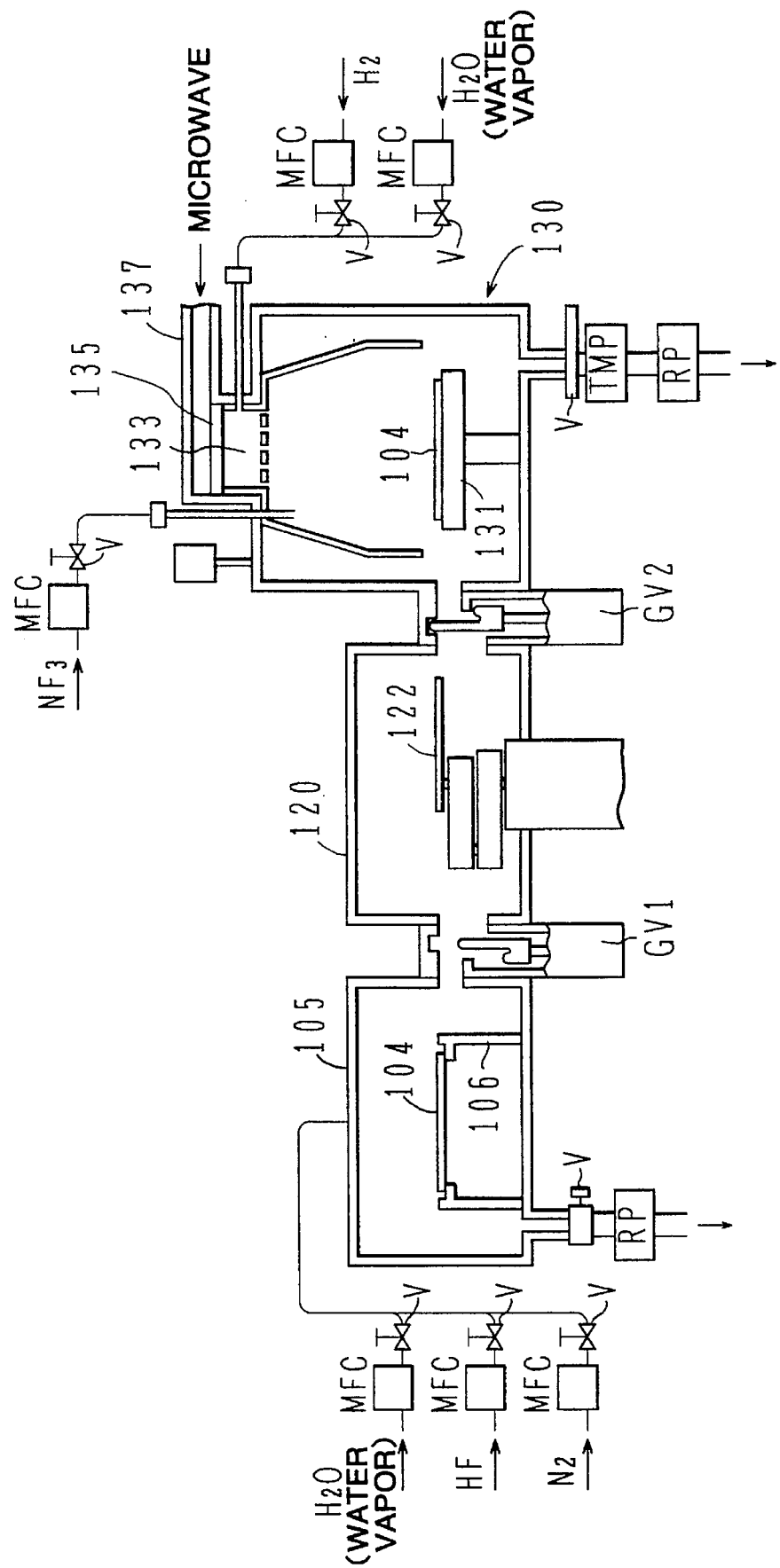
FIG. 10 is a schematic cross sectional view showing a silicon wafer surface process suitable for mass production.

FIG. 10 shows an example of the structure of an HF vapor processing system suitable for mass production. A silicon wafer 104 is placed on a jig 106 mounted in an HF vapor processing chamber 105. The HF vapor processing chamber 105 has the inner surface fully coated with Teflon. All the material of the chamber 105 may be Teflon. Desired amounts of $H_2O$, HF, and $H_2$ gases are supplied via mass flow controllers MFC and valves V to the HF vapor processing chamber 105.

A rotary pump RP is coupled via a valve V to the HF vapor processing chamber 105 to evacuate the inside of the chamber 105. The chamber 105 is also coupled to a load-lock chamber 120 via a gate valve GV1.

A wafer handling robot 122 movable both in the vertical and horizontal directions is disposed in the load-lock chamber 120 so that a wafer can be picked out of the HF vapor processing chamber 105 and transported to a next downflow processing chamber 130 which is coupled via another gate valve GV2 to the load-lock chamber 120.

A heating stage 131 is disposed in the downflow processing chamber 130 to hold a silicon wafer placed thereon. A plasma generating chamber 133 is formed above the heating stage 131 and coupled through a metal mesh. The plasma generating chamber is coupled via a quartz window 135 to a waveguide 137. The waveguide 137 transmits and supplies microwaves to the plasma generating chamber 133. $NF_3$ gas is supplied via a mass flow controller MFC and a valve V to the downflow processing chamber from the top thereof.

$H_2$ and $H_2O$ gases are supplied via mass flow controllers MFC and valves V to the plasma generating chamber 133. An evacuation system constituted by a turbo molecular pump TMP and a rotary pump RP is connected via a valve V to the downflow processing chamber 130 at the bottom thereof. With this arrangement, the wafer 104 in the load-lock chamber 120 is transported to the HF vapor processing chamber 105 where a native oxide film is removed by the HF vapor process. The wafer 104 with its native oxide film having been removed is then transported again by the wafer handling robot 122 in the load-lock chamber to the downflow processing chamber 130.

In the downflow processing chamber, a dry process having the cumulative effects of $H_2+H_2O$ plasma and $NF_3$ additive gas is performed to remove residual by-products such as fluoride attached to the wafer surface. The wafer with by-products having been removed is heated by the heating stage 131 to further remove by-products through evaporation. Thereafter, the wafer 104 is retrieved via the load-lock chamber 120.

Figure 11:
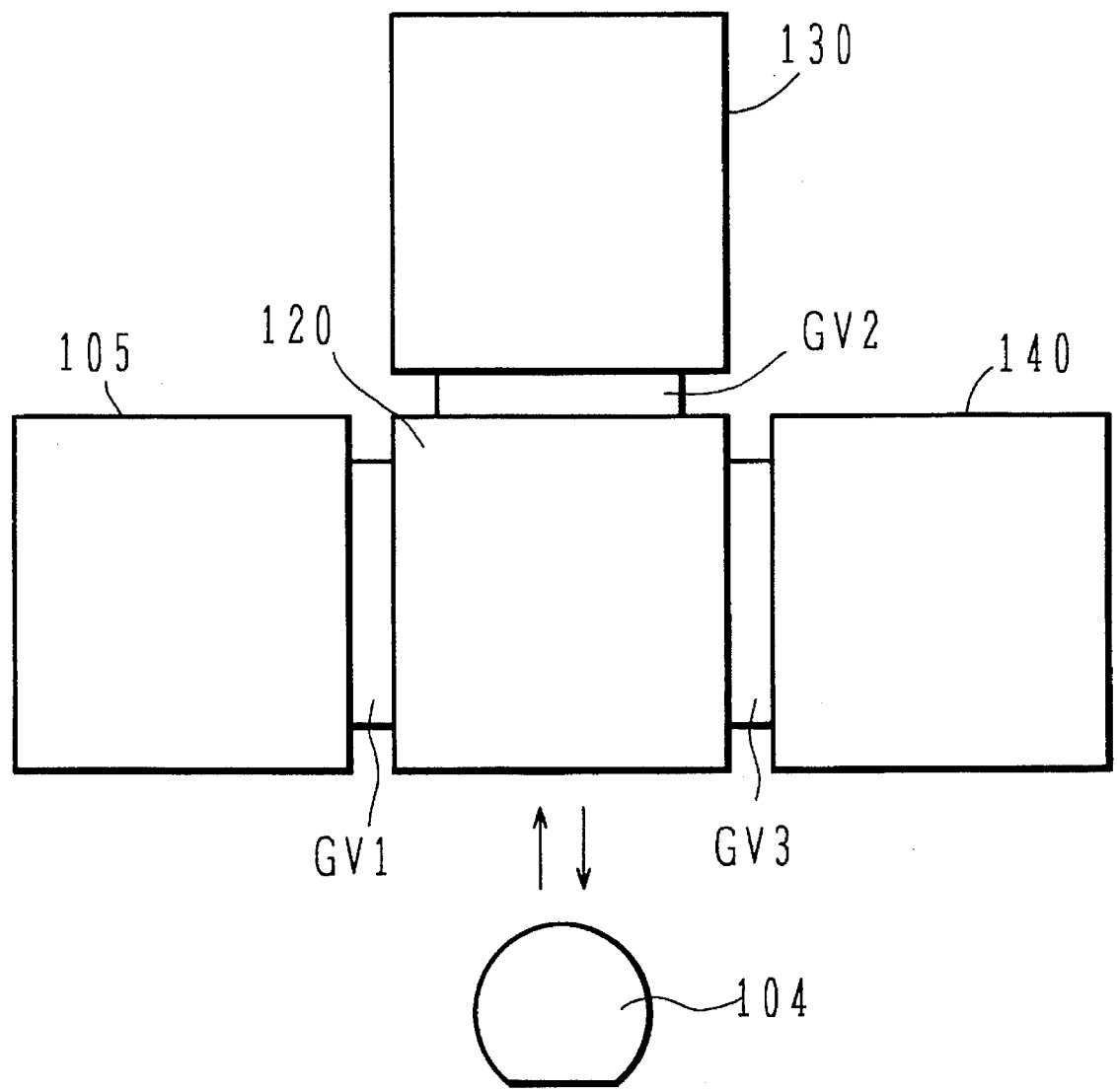
FIG. 11 is a schematic block diagram showing an example of a manufacturing system combining a silicon wafer surface processing system and a film forming system.

FIG. 11 shows the structure of a system combining the above-described processing system and a film forming system. A load-lock chamber 120 is coupled via gate valves GV1, GV2, and GV3, to an HF vapor processing chamber 105, a downflow processing chamber 130, and a film forming chamber 140.

A wafer 104 is first transported through the load-lock chamber 120 to the HF vapor processing chamber 105, whereat a native oxide film is removed by the HF vapor process. Then, in the downflow processing chamber 130, residual by-products are removed. Then, in the film forming chamber 140 a film is formed on the surface of the wafer 104. In this manner, a film is formed on the clean silicon surface.

In the above embodiment, a combination of the HF vapor process and the hydrogen radical process has been described. A native oxide film on a silicon wafer surface may be removed by using only the hydrogen radical process (with additive $NF_3$).

The present invention has been described in connection with the preferred embodiments. The invention is not limited only to the above embodiments. It is apparent to those skilled in the art that various modifications, improvements, combinations and the like can be made without departing from the scope of the appended claims.

I claim:

1. A method of manufacturing a semiconductor device comprising:

applying a gas containing HF and one of $H_2O$ and an alcohol to a substrate to produce an HF treated substrate;

providing a hydrogen containing gas;

applying an excitation energy to said hydrogen containing gas at a plasma generating region to thereby generate a plasma in said hydrogen containing gas;

causing said hydrogen containing gas to flow from said region to a first position that is downstream from said region, at which first position high energy particles in the hydrogen containing gas have decayed sufficiently so that the concentration of high energy particles in the hydrogen containing gas has become negligible;

adding nitrogen fluoride to said hydrogen containing gas at said first position to produce a treatment gas;

causing said treatment gas to flow from said first position to a second position that is further downstream; and contacting a surface of said HF treated substrate with said treatment gas at said second position to thereby remove imperfect oxide contamination from said surface.

2. A method of manufacturing a semiconductor device as set forth in claim 1, wherein said contacting is discontinued without exposing the substrate to an oxidizing atmosphere.

3. A method of manufacturing a semiconductor device as set forth in claim 1, wherein said substrate is heated to a temperature of at least 80° C. to evaporate by-products remaining on said surface of the substrate after said contacting of said surface with said treatment gas.

4. A method of manufacturing a semiconductor device as set forth in claim 3, wherein said heating of the substrate is performed in an atmosphere of one of hydrogen, nitrogen, or argon.

5. A method of manufacturing a semiconductor device as set forth in claim 3, wherein said heating of the substrate is performed in a vacuum.

6. A method of manufacturing a semiconductor device as set forth in claim 3, wherein said by-products include fluorine.

7. A method of manufacturing a semiconductor device as set forth in claim 1, wherein said contamination on said surface comprises a native oxide film and said hydrogen containing gas further comprises molecules containing oxygen atoms.

8. A method of manufacturing a semiconductor device as set forth in claim 7, wherein said excitation energy is microwave energy.

9. A method of manufacturing a semiconductor device as set forth in claim 7, wherein is included an initial start up procedure comprising, in seriatim, first introducing hydrogen gas to said region, second beginning the addition of said nitrogen fluoride at said first position, and thereafter beginning to mix said one of $H_2O$ and an alcohol with said hydrogen gas upstream from said region.

10. A method of manufacturing a semiconductor device as set forth in claim 9, wherein is included a shutdown procedure comprising, in seriatim, first stopping the mixing of said one of $H_2O$ and an alcohol with said hydrogen gas, second stopping the addition of nitrogen fluoride at said first position, and only thereafter stopping the flow of hydrogen gas to said region.

11. A method of manufacturing a semiconductor device as set forth in claim 7, wherein said substrate is immersed in pure water having reduced dissolved oxygen content after the contamination has been removed therefrom.

12. A method of manufacturing a semiconductor device as set forth in claim 1, wherein said one of $H_2O$ and an alcohol is $H_2O$.

\* \* \* \* \*

UNITED STATES PATENT AND TRADEMARK OFFICE
CERTIFICATE OF CORRECTION

PATENT NO. : 5,620,559
DATED : Apr. 15, 1997
INVENTOR(S) : KIKUCHI

It is certified that error appears in the above-indentified patent and that said Letters Patent is hereby corrected as shown below:

Col. 1, line 64, change "or" to --on--.

Col. 2, line 23, after "vapor" (first occurrence) delete "thereto"; after "vapor" (second occurrence) insert --thereto--;
line 57, change "byproducts" to --by-products--.

Col. 6, line 24, delete "acti-";
line 25, delete in its entirety.

Col. 10, line 23, after "downstream from the" insert --plasma--.

Col. 11, line 37, change "whereat" to --where--.

Signed and Sealed this

Sixteenth Day of December, 1997

Attest:

BRUCE LEHMAN

Attesting Officer

Commissioner of Patents and Trademarks